US006862703B2

(12) United States Patent
Oonk (10) Patent No.: US 6,862,703 B2
(45) Date of Patent: Mar. 1, 2005

(54) APPARATUS FOR TESTING MEMORIES WITH REDUNDANT STORAGE ELEMENTS

(75) Inventor: John Mark Oonk, San Ramon, CA (US)

(73) Assignee: Credence Systems Corporation, Milpitas, CA (US)

( * ) Notice: Subject to any disclaimer, the term of this patent is extended or adjusted under 35 U.S.C. 154(b) by 715 days.

(21) Appl. No.: 09/929,712

(22) Filed: Aug. 13, 2001

(65) Prior Publication Data

US 2003/0033561 A1 Feb. 13, 2003

(51) Int. Cl.[7] .............................................. G11C 29/00
(52) U.S. Cl. ...................... 714/718; 714/704; 714/706
(58) Field of Search ................................ 714/718, 704, 714/708

(56) References Cited

U.S. PATENT DOCUMENTS

| 4,833,652 | A | * | 5/1989 | Isobe et al. ................. 365/201 |
| 5,795,797 | A | * | 8/1998 | Chester et al. ................. 438/4 |
| 6,256,757 | B1 | * | 7/2001 | Arkin ......................... 714/718 |
| 6,744,822 | B1 | * | 6/2004 | Gaddam et al. ............ 375/265 |

* cited by examiner

*Primary Examiner*—Phung My Chung
(74) *Attorney, Agent, or Firm*—Daniel J. Bedell; Smith-Hill and Bedell (57) ABSTRACT

A memory tester tests a random access memory device under test (DUT) comprising addressable rows and columns of memory cells, and provides a computer with enough information to determine how to efficiently allocate spare rows and columns for replacing rows and columns containing defective memory cells. During a test the memory tester writes a "fail" bit into each address of an error capture memory (ECM) to indicate whether a correspondingly addressed memory cell of the DUT is defective. The tester also includes a set of programmable area fail counters, each for counting of the number of memory cells within a separately selected area of the memory's address space. After the test, the computer processes the counts to determine whether it needs to allocate the spare rows and columns and, in some cases, to determine how to allocate the spare rows and columns. When it cannot allocate spare rows and columns on the basis of the counts alone, the computer commands the tester to read the fail bits in selected areas of the ECM's address space to determine the addresses of the defective memory cells and to supply those addresses to the computer to enable it to determine how to allocate spare rows and columns.

22 Claims, 8 Drawing Sheets

APPARATUS FOR TESTING MEMORIES WITH REDUNDANT STORAGE ELEMENTS

BACKGROUND OF THE INVENTION

1. Field of the Invention

The present invention relates in general to memories having spare rows and columns of memory cells that can be used to replace rows and columns having defective cells, and in particular to an apparatus for testing such a memory and for generating data for facilitating allocation of spare rows and columns.

2. Description of Related Art

A typical random access memory (RAM) includes an array of rows and columns of memory cells, each cell having a unique combination of row and column address. Many RAMs include redundant storage elements in the form of spare rows and columns of memory cells. When such a RAM is found to have a defective memory cell, a row or column containing that memory cell can be replaced with one of the RAM's spare rows or columns by using a laser or other means to alter the RAM so that the spare row or column is addressed in lieu of the row or column containing the defective cell.

Each cell resides in one row and one column of a RAM, and when a cell is defective it can be repaired by replacing either its row or column with a spare row or column. However when a RAM has many defective cells it is important to allocate spare rows and columns efficiently. For example assume a RAM has one spare row and three spare columns. Assume also that the RAM has 6 defective cells with three of them occurring in its first row. If we replace the first row with the spare row, then we can use the three spare columns to replace columns containing the three defective cells that are not in the first row. However if we use the three spare columns to replace the columns containing the three cells in the first row, we may not have enough remaining spare rows and columns to replace the three cells that are not in the first row.

Prior art memory testers typically test each memory cell of a RAM device under test (DUT) by writing data to the memory cell and then reading the data back out to determine whether the data read out matches the data written into the cell. A high speed memory tester employs a pattern generator or counters to produce the data, address and control signals needed to write data into the memory cells and read it back out. A hardware comparator typically compares the memory input and output data and supplies data indicating the result of the comparison to an "error capture memory" having one storage memory for each memory cell to store the results of the comparison. After each memory cell of the DUT has been tested, the contents of the error capture memory constitutes a bit map of the DUT, with each bit indicating whether a corresponding memory cell of the DUT is defective. Following the test, a computer reads the contents of the error capture memory and determines therefrom how to best allocate spare rows and columns when replacing the defective memory cells.

One problem with such a system is that since the error capture memory has to have as many cells as the memory being tested, it can take a relatively long time for the computer to read all of the data out of the error capture memory. In a production environment where thousands of memories are being tested in succession, the total time the computer requires to read the captured error data is substantial and comprises a significant portion of the time required to test and repair the memories.

U.S. Pat. No. 6,256,757 entitled "Apparatus for Testing Memories with Redundant Storage Elements" issued Jul. 3, 2001 to Brian Arkin, et. al, describes an apparatus for testing a memory formed by rows and columns of memory cells. The test apparatus includes an error capture memory for keeping track of the defective cells, but also includes a separate counter for each row and each column of the array. Whenever the tester finds a defective memory cell, it not only makes note of the failed cell in the error capture memory, it increments the count of the counters corresponding to the defective cell's row and column. Thus at the end of a memory test, the counts indicate the number of defective cells in each row and in each column. The tester sends the counts to a computer which can usually determine how to allocate spare rows and columns to repair the memory on the basis of the counts alone. The test apparatus therefore sends data from the error capture memory to the computer only when the computer is unable to determine how to repair the memory solely on the basis of counts. The system is advantageous because the test apparatus can forward the relatively small amount of count data to the computer much faster than the relatively large amount of error capture memory data. However since the test apparatus must provide a separate counter for each row and column of the array, the apparatus requires a large number of counters in order to test memories having a large number of rows and columns.

Thus it would be beneficial to provide a memory test system that can test a memory and quickly provide a computer with a relatively small amount of data that will enable the computer to determine how to allocate spare rows and columns, which does not require the computer to always read the entire contents of an error capture memory, and which need not provide a separate counter for each row and column of the memory.

SUMMARY OF THE INVENTION

A memory tester in accordance with the invention tests a random access memory device under test (DUT) comprising an array of rows and columns of memory cells, each having a separate row and column address. The tester provides a computer with enough information to determine how to efficiently allocate spare rows and columns for replacing rows and columns containing defective memory cells. As the tester tests each memory cell residing at a particular address within the DUTs, it writes a fail data bit into a corresponding address of an error capture memory (ECM) to indicate whether the memory cell is defective.

In accordance with one aspect of the invention, the tester includes a set of "area fail" counters, and during the test, each counter counts the number of defective memory cells in a separate rectangular area of the DUT's memory space. The particular area each counter monitors for defective cells is separately programmable for each counter.

In accordance with another aspect of the invention, the computer reads the counts in one or more of the area fail counters when the test is completed to determine whether the DUT has any defective cells, and if so, which areas of the DUT's memory space contain the defective cells. In some cases, the computer will be able to determine whether and how to allocate spare rows and columns to replace DUT rows and columns containing defective memory cells on the basis of the count data alone.

When the computer is unable to determine how to allocate spare rows and columns from the count data alone, the computer directs the tester to read data from selected areas of the ECM's memory space corresponding to areas of the DUT known to contain defective cells, and to return addresses of defective cells to the computer. Since the count data indicates the particular areas of the DUT that contain defective cells, the count data enables the computer to efficiently select the corresponding areas of the ECM's memory space that are to be read. Thus the area fail counts help to minimize the amount of time the computer needs to determine how to allocate spare rows and columns because the information they convey helps to reduce the amount of ECM data that the tester must read and helps to reduce the amount of data the tester must send back to the computer.

It is accordingly an object of the invention to test a memory having spare rows and columns and to quickly provide a computer with a small amount of data that is sufficient to enable it to determine how to efficiently allocate spare rows and columns to replace rows and columns containing defective memory cells.

The claims portion of this specification particularly points out and distinctly claims the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DESCRIPTION OF THE PREFERRED EMBODIMENT(s)

Figure 1:
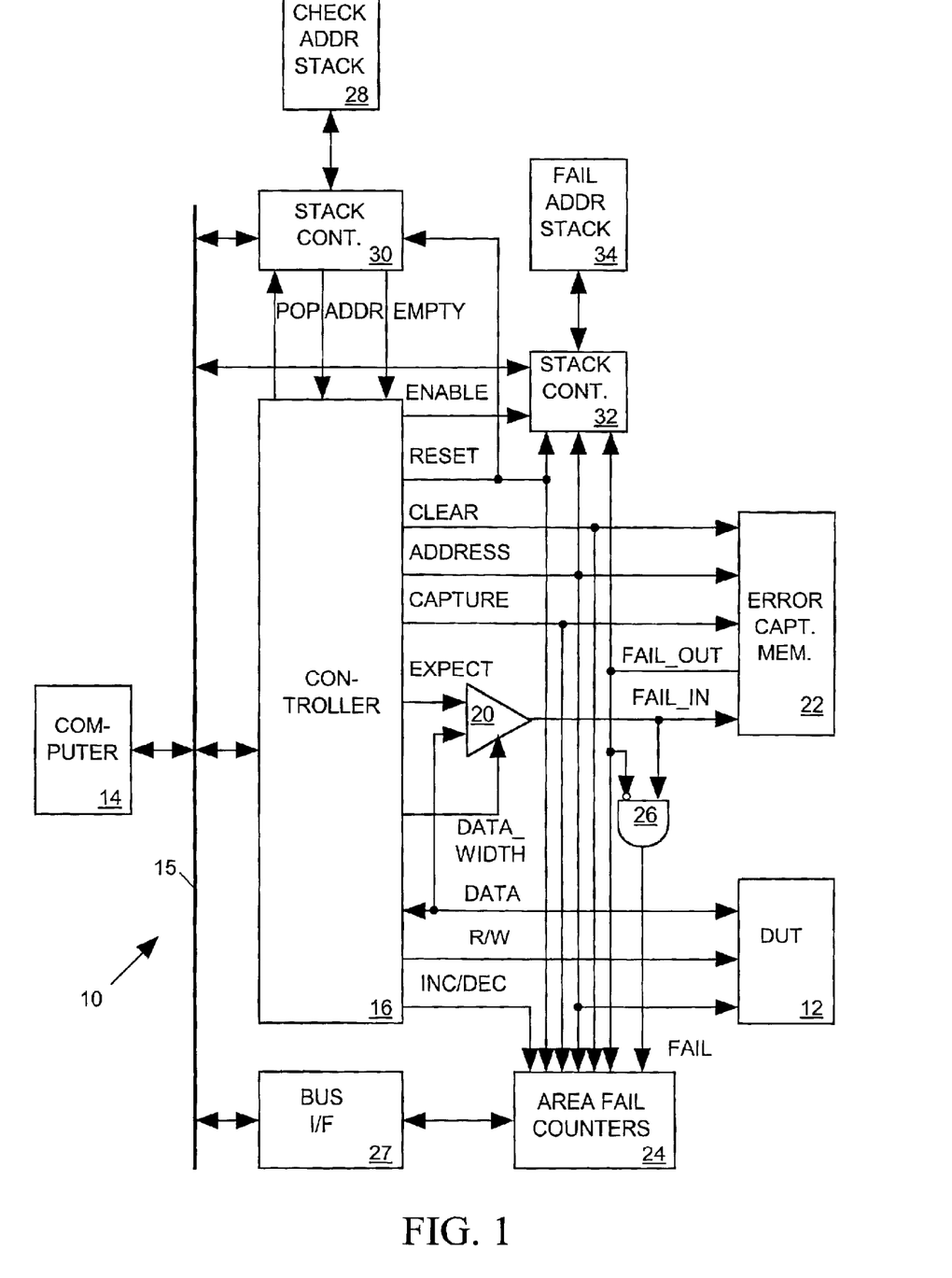
FIG. 1 illustrates in block diagram form a memory tester 10 in accordance with the present invention for testing a random access memory (RAM)

FIG. 1 illustrates in block diagram form a memory tester 10 in accordance with the present invention for testing a random access memory device under test (DUT) 12. DUT 12 includes an array of rows and columns of memory cells, each cell having a unique combination of row and column addresses and each cell storing a word of one or more data bits. DUT 12 also includes several spare rows and/or columns. When DUT 12 has defective memory cells, rows or columns containing those defective memory cells can be replaced with the spare rows or columns. The replacement may be carried out, for example, using a laser or other means to modify the RAM so that a spare row or column is addressed in lieu of a row or column containing the defective cell. Memory tester 10 tests DUT 12 to determine which cells of DUT are defective and provides data indicating test results to a computer 14 via a conventional computer bus 15. Computer 14 analyzes the data to determine how to allocate the DUT's spare rows and columns based on the test results data.

Memory Testing

Tester 10 can test memories of various sizes with respect to numbers of rows and columns of cells and numbers of bits stored at each memory address. Computer 14 sends control data to tester 10 via a bus 15 to appropriately configure tester 10 for the particular memory DUT 12 to be tested. Thereafter, computer 14 transmits a "TEST" command to tester 10 via bus 15 to tell it to start the test. Tester 10 then tests DUT 12 by writing data into each memory cell of DUT 12, reading the data back out of the memory cell, and comparing the memory's input and output data to see when they match. A cell is considered defective when it does not read out the same data value written into it. Tester 10 may be programmed to carry out any of a wide variety of well-known test patterns when testing DUT 12, but all test patterns should check each memory cell at least twice to make sure that the cell properly stores and reads back both a logical "0" and a logical "1" in each of its bit positions. Many test patterns check memory cells more than twice, for example to make sure that each cell can properly read various word data patterns.

Figure 2:
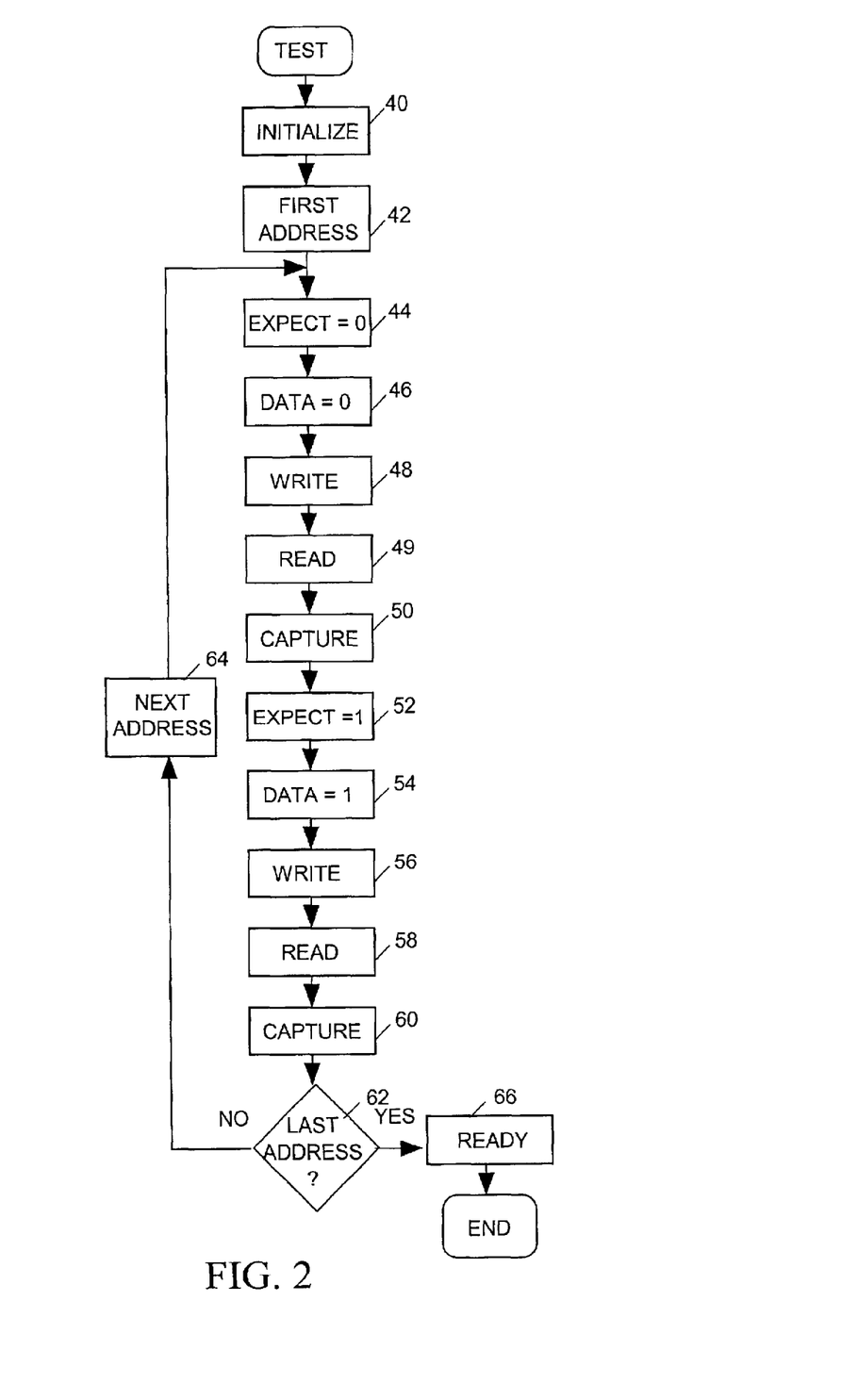
FIG. 2 is a flow chart indicating a manner in which the controller of the memory tester responds to a TEST command.

FIG. 2 is a flow chart illustrating a simple example test pattern tester 10 might execute in response to the TEST command wherein it tests each cell to determine whether it properly stores and reads out data. Referring to FIGS. 1 and 2, upon receiving the TEST command, a controller 16 initializes tester 10 (step 40) in a manner described below. Controller 16 then supplies the address of the first cell of the first row as an address input (ADDRESS) to DUT 12 (step 42), sets each bit of an EXPECT data value to a logical 0 (step 44) and sets each bit of data (DATA) on a data bus input to DUT 12 to a logical 0 (step 46). Controller 16 then sets a read/write control signal (R/W) input to DUT 12 to tell it to write its current DATA input into the address indicated by its current ADDRESS input (step 48). Thereafter, controller 16 sets the R/W signal to tell DUT 12 to read the stored data back onto the DATA bus (step 49). A comparator 20 compares the EXPECT data to the data read out of DUT 12 and generates a FAIL_IN signal of a logical "0" state when the two data values match and of a logical "1" state when the two data values fail to match.

The ADDRESS input to DUT also addresses an error capture memory (ECM) 22 having a separate single-bit cell corresponding to each memory cell of DUT 12. During the initialization process (step 40) controller 16 writes a "0" to each bit of each ECM cell. After comparator 20 has set the state of its output FAIL_IN signal, controller 16 pulses a read/write control signal (CAPTURE) input to ECM 22 (step 50). When the FAIL_IN output of comparator 20 is a "1," ECM 22 writes a "1" to its currently addressed ECM cell. However when the FAIL_IN bit is a "0," ECM 22 does not write a data bit to the currently addressed ECM cell.

Controller 16 then sets each bit of the EXPECT data corresponding to each I/O pin of DUT 12 to a "1" (step 52), sets each bit of the data on the DATA bus to a "1" (step 54), signals DUT 12 to write the data to its currently addressed cell (step 56), and then signals DUT 12 to read the data back out onto the DATA bus (step 58). Controller 16 thereafter again pulses the CAPTURE signal (step 60). At this point the FAIL_IN data output of comparator 20 will be a "0" if the DUT's DATA output matches the EXPECT data (all 1's) and will otherwise be a 1 if the DUT's DATA output fails to match the EXPECT data. When controller 16 thereafter again pulses the CAPTURE signal (step 60), ECM 22 responds by storing a 1 in its currently addressed cell if the FAIL_IN bit is a true and by otherwise leaving the contents of the ECM cell unchanged.

Thus following step 60 the contents of the currently addressed ECM cell 22 will be a "0" if the corresponding cell of DUT 12 properly stores and reads out both 0's and 1's and will be a "1" if the corresponding DUT cell otherwise fails to properly store and read out either 0's or 1's.

When the current ADDRESS input to DUT 12 is not the last address to be tested (step 62), controller 16 sets the ADDRESS input to address a next address to be tested (step 64) and then repeats steps 44 through 60 to test that next address of DUT 12, thereby causing ECM 22 to store a 1 or a 0 bit in a next ECM cell to indicate whether the next addressed cell of DUT 12 is defective. Steps 44–64 are repeated for each memory cell of DUT 12 so that after the last memory address of DUT 12 has been tested, the contents of ECM 12 constitutes a bit map of the defective cells of DUT 12. At that point controller 16 transmits a READY command to computer 14 (step 66) via bus 15 to tell the computer that it has finished testing DUT 12.

Area Fail Counters

In accordance with the invention, tester 10 also includes a set of programmable "area fail counters" 24. Each area counter 24 can be programmed to count the number of defective cells in a particular rectangular area of the two-dimensional (row and column) address space of the DUT 12. Any cell address may be expressed as a data pair (X,Y) where X is the row address and Y is the column address of the cell. A rectangular "area" of the address space DUT 12 may be defined by addresses (X1, Y1) and (X2,Y2) of opposing corners of that rectangular area. Before the start of a test, computer 14 sends separate programming data to each fail counter 24 via bus 15 and a bus interface circuit 27 defining the area of the address space of DUT 12 for which it is to count cell failures. After the test is complete, computer 14 obtains the counts from fail counters 24 via bus interface circuit 27. As discussed in more detail below, the area fail counts can enable computer 14 to quickly determine which areas of DUT 12, if any, contain defective cells. That information enables computer 14 to greatly reduce the amount of error data it has to read out of error capture memory 22 in order to determine which of its rows and columns, if any, need to be replaced with spare rows and columns. In some cases computer 14 may be able to avoid having to read any error data out of error capture memory 22 and rely solely on the area fail counts to determine which rows and columns are to be replaced.

During the initialization step 40 (FIG. 2), controller 16 pulses a RESET signal that resets (zeros) the counts of all counters 24. During the test each counter 24 counts the number of failed cells residing its corresponding rectangular area of the DUT's memory space. To do so, each counter 24 monitors the ADDRESS bus and enables its count whenever the current cell address resides within the counter's corresponding memory space area. Computer 14 may program fail counters 24 for overlapping areas of memory space so that whenever controller 16 puts an address of a memory cell on the ADDRESS bus, one or more counters 24 may enable their counts.

Each counter 24 receives a FAIL signal produced by an AND gate 26. AND gate 26 receives the FAIL_IN output of comparator 20 at a non-inverting input and receives at an inverting input the contents (FAIL_OUT) of the currently addressed ECM cell. Immediately before controller 16 pulses the CAPTURE signal, the output of AND gate 26 is a "1" if the FAIL_IN signal is a "1" and the contents (FAIL_OUT) of the currently addressed ECM cell is a "0". Otherwise the AND gate sets the FAIL signal to a "0". Each counter 24 receives the CAPTURE signal produced by controller 16 at steps 50 and 60 (FIG. 2). Any currently enabled counter 24 will increment its count in response to the leading edge of the CAPTURE signal pulse when the FAIL signal input is a "1" and otherwise refrain from incrementing its counts. Thus although a cell at some memory address may fail both the "0" and "1" read/write tests each counter 24 programmed for counting failures in the area of space in which the cell's address resides will only count the first detected failure of that cell. Therefore, at the end of the test, the count maintained by each counter 24 indicates the number of defective cells whose addresses lie within some defined area of the DUT's address space.

Error Analysis

After receiving the READY signal from controller 16 following the end of the test, computer 14 can read the count outputs of the various counters 24 via bus 15 and interface 27. The count data alone normally does not provide enough information to allow computer 14 to determine which particular cells are defective, but it does enable computer 14 to determine which areas of the address space of DUT 12 contain defective cells, and how many defective cells are included in each area. However the count data can tell computer 14 when DUT 12 does not need to be repaired, and in most cases where DUT 12 does have defective cells, the count data helps enables computer 14 to substantially reduce the amount of fail data it must read out of ECM 22 in order to determine which rows and columns must be replaced.

Figure 3:
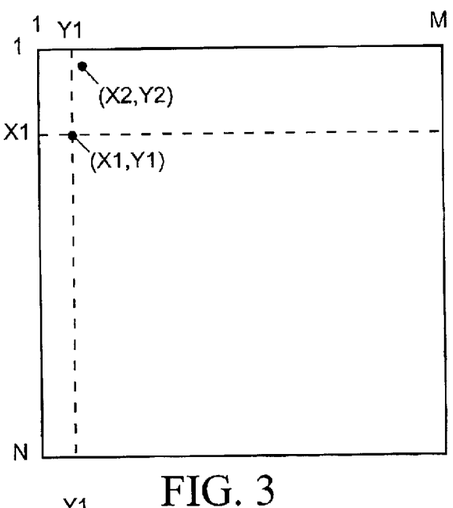
FIGS. 3–6 illustrates a manner in which various areas of the memory space of the RAM being tested may be assigned to the fail counters of FIG. 1.
Figure 4:
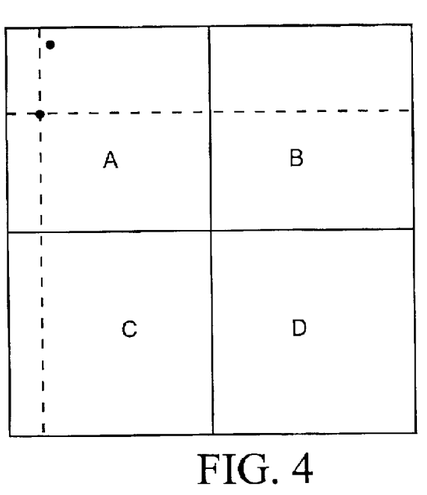

Computer 14 can program each area fail counter 24 to count cell failures in any area of the memory space of DUT 12. FIGS. 3–6 illustrate one example pattern for assigning memory areas to the various fail counters 24. Assume that DUT 12 has N rows and M columns of cells and that there are at least 37 fail counters 24. One counter 24 is programmed to act as a "first level" counter for counting all defective cell in the entire N×M memory array of DUT 12 as illustrated in FIG. 3. A set of four counters 24 are programmed to act as "second level" counters each assigned to count defective cells in a separate one of areas A–D of the DUT's memory space as illustrated in FIG. 4. Area A includes cells having row addresses within the area defined by corners (1, 1) and (N/2, M/2). Area B includes cell addresses bounded by corners (1, M/2+1) and (N/2, M). Area C is bounded by corners (N/2+1, 1) and (N, M/2) and area D is bounded by corners (N/2+1, M/2+1) and (N,M).

Figure 5:
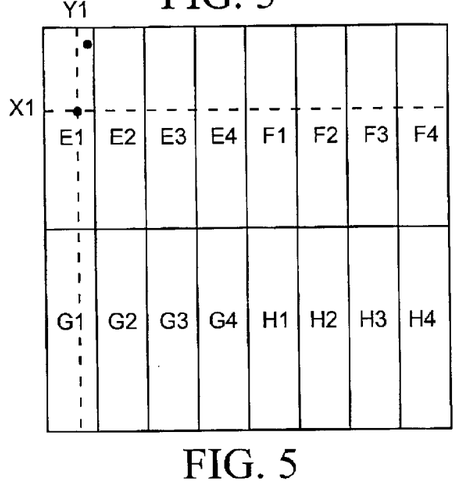
Figure 6:
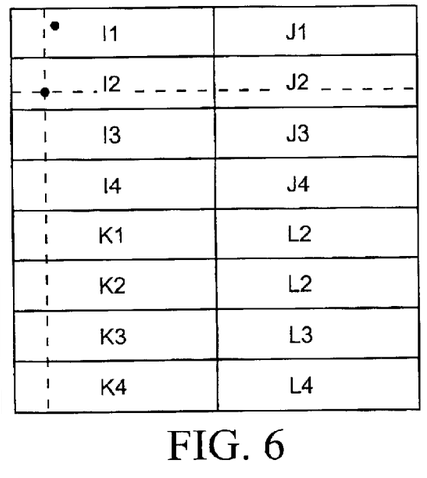

As illustrated in FIGS. 5 and 6, another set of 32 registers 24 are programmed to act as "third level" counters for counting defective cells in areas E1–E4 and I1–I4 (vertical and horizontal subdivisions of area A), areas F1–F4 and J1–J4 (vertical and horizontal subdivisions of area B), areas G1–G4 and K1–K4 (vertical and horizontal subdivisions of area C), and areas H1–H4 and L1–L4 (vertical and horizontal subdivisions of area D).

Figure 7:
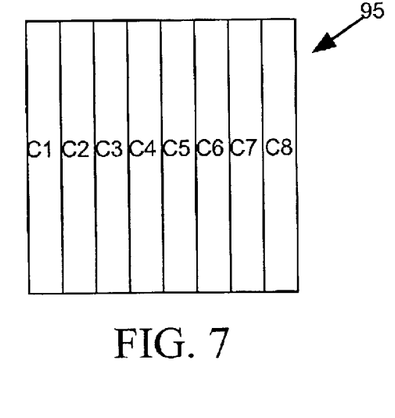
FIGS. 7 and 8 illustrates another manner in which various areas of the memory space of the RAM being tested may be assigned to the fail counters of FIG. 1.
Figure 8:
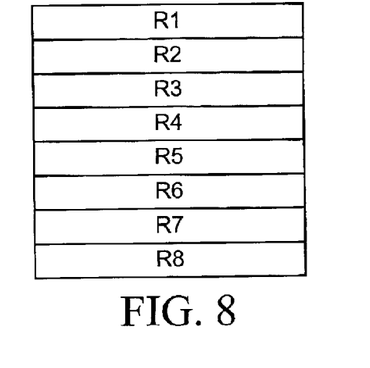

FIGS. 7 and 8 illustrate another example pattern for partitioning the memory space among various fail counters 24 of FIG. 1. One counter 24 is assigned to count the total number of fails for the entire memory space 95. Each of a first set of eight counters is assigned to count total number of fails in a separate one of eight areas C1–C8 as illustrated in FIG. 7. Each of a second set of eight counters is assigned to counter total number of fails in a separate one of eight areas R1–R8 as illustrated in FIG. 8. Each area C1–C8 includes all cells of several adjacent columns and each area R1–R8 includes all cells of several adjacent rows. With this arrangement, should the computer find it necessary to read data out error capture memory 22 to determine the precise row and column address of a failed cell, the counts enable the test computer to limit its search to the relatively small area at the intersection between the counters' assigned row and column areas which is only ¹⁄₆₄th the size of the entire memory array.

Since it is not necessary that areas C1–C8 and R1–R8 be exactly the same size, any sized memory space can be partitioned as needed to make use of all available counters 22. Also the relative numbers of row and column oriented partitions can be adjusted in portion to the relative number of rows and columns of the array or in proportion to the relative number of spare rows and columns. The ability to independently program each counter 22 to count errors in any desired rectangular area of the memory array gives the user great flexibility to partition the memory array in a manner that best suits the dimensions of the array being tested and the number of available spare rows and columns.

FIG. 8 illustrates an example procedure computer 14 may use to determine how to allocate spare rows and columns to replace rows and columns of DUT 12 containing defective cells. When tester 10 has finished testing DUT 12, computer 14 reads the count data for the single "first level" register 24 that counts the number of failed cells in the DUT's entire address space as depicted in FIG. 3 (step 70). If that count is zero (step 72), then computer 14 will know that no row or column replacements are necessary and can immediately terminate the error analysis process (step 74) without having to acquire any more test results data from tester 10. Thus when there are no defective cells, computer 14 need only read the count output of the single first level counter 24 and does not have to read any data out of ECM 22.

When there is at least one failed cell, computer 14 would find at step 72 that the count output of the top level counter 24 would be greater than 0 and would therefore read the outputs of the four second level counters 24 associated with areas A–D of FIG. 4 (step 76). For example, if a single failed cell occurred at an address (X1, Y1) as illustrated in FIGS. 3–6, the second level counter 24 for area A would return a count of 1 and the second level counters for areas B–D would return 0 counts. Since area A has the highest number of failed cells of all second level areas A–D, computer 14 would respond to the second level counts by looking only at the outputs of the third level counters 24 assigned to count numbers of defective cells in the four vertical and horizontal subdivisions E1–E4 and I1–I4 of area A (step 78).

Computer 14 then (step 80) determines on the basis of the data it has thus far acquired from tester 10 whether it can allocate one or more spare rows or columns to fix one or more cell failures (step 82), whether the DUT must be discarded (step 83) because there are insufficient numbers of spare rows and columns to replace the failed cells, or whether it should obtain more detailed fail data from the error capture memory (step 86) in order to determine how to allocate spare rows and columns.

For example if there is only a single failed cell at address (X1, Y1), computer 14 would be able to determine from the third level counts acquired at step 78 that the failed cell resides somewhere within the intersection of areas E1 and I2. But it would not know at this point the actual address of the failed cell. If there were a sufficient number of spare columns to replace every column spanned by area E1 or a sufficient number of rows to replace every row spanned by area I2, then computer 14 could simply decide at step 80 to replace every column passing though area E1 with a spare column or to replace every row passing though area I1 with a spare row and to then appropriately allocate spare rows or columns at step 82. However when there are not enough columns or rows to replace every column or row spanned by areas E1 or I1 then computer 14 would decide at step 80 that it must read the fail data out of ECM associated with one or more of the third level areas showing high counts (step 86).

When, for example, there is a single failed cell at address (X1, Y1) computer 14 knows that the failed cell lies in the area at the intersection of areas E1 and I2, and therefore need only read ECM data for that small intersection area at step 86. Next (step 88) computer 14 again tries to determine whether the data it has thus far gathered indicates that it can allocate at least one spare row or column (step 82) or that the DUT cannot be repaired and must be discarded (step 83). When there is only a single failed cell at (X1, Y1), computer 14 would be able to immediately allocate either a spare row or column to replace the row or column containing the defective cell (step 82). Thus when DUT 12 contains only a single defective cell, the area counter patterns illustrated in FIGS. 3–6 enable computer 14 to quickly acquire a relatively small amount of data from tester 10 that will enable it to determine how to allocate spare rows or columns to fix the DUT without having to read all of the data in ECM 22.

Sometimes every cell along an entire row or column will fail. For example, when all cells along the row X1 represented by a horizontal dotted line of FIGS. 3–6 fail, computer 14 will find at step 70 that the top level area fail counter 27 indicates M failures, one for each cell along row X2. At step 76 computer would find that the counters 24 associated with areas A and B would each produce counts of M/2. Computer 14 next looks at the area counter 24 associated with the subdivisions E1–E4 and I1–I4 of area A (step 78) and finds that area E1 contains M/8 failed cells and area I2 contains M/2 failed cells. Since third level area I2 has the greatest number of cells, computer 14 next retrieves the fail data contents of error capture memory 22 associated only with area I2 (step 86) since that area has the most failed cells of all third level areas. Since it would find from the fail data that all errors occur along row X1, computer 14 would be able to determine at step 88 that row X1 must be replaced with a spare row, assuming there are not enough spare columns to replace all of failed cells along row X1, Computer 14 would therefore allocate a spare row to that replace row X1 (step 82).

Computer 14 then (step 84) signals tester controller 16 to "clear" the row of error capture memory 22 associated with row X1 by resetting the fail data bit at every address along that row to indicate that the cell is not defective. To do that controller 16 initially supplies the address (X) of the first cell of row X1 to ECM 22 to signal ECM 22 to read out the fail data bit (FAIL_OUT) stored at that address to area fail counters 24. Controller 16 then pulses a CLEAR signal input to error capture memory 22 and counters 24. The leading edge of the CLEAR signal pulse tells each counter 24 assigned to count failures in an area of DUT 12 memory space containing address (X1, 1) to decrement its fail count, provided that the FAIL_OUT data bit is a 1 indicating that the cell at that address is defective. The trailing edge of the CLEAR signal tells error capture memory 22 to reset the FAIL_OUT bit stored at address (X1, 1) to 0 indicate that the cell at that address is no longer defective. Controller 16 then sets its ADDRESS output to (X1, 2) and again pulses the CLEAR signal to cause ECM 22 to read out the FAIL_OUT data for the cell at address (X1, 2), to cause the fail counters 24 counting cell failures in the memory space area containing that address to decrement their counts if the FAIL_OUT data indicates the cell at that address is defective, and to signal ECM 22 to reset the fail data at that address to 0. Controller 16 repeats the process for each cell along row X1 so that fail bits in ECM 22 for all cells of row X1 are set to 0 and so that all counters 24 counting fails anywhere along row X1 appropriately decrement their counts.

After row X1 of ECM 22 has been cleared at step 84, the fail data stored in ECM 22 and the counts of counters 24 will look as if row X1 had no defective cells. At that point computer 14 repeats the error analyses process, starting at step 70 where it looks at the count output of first level counter 24 (step 70) to determine whether DUT 12 would still have any defective cells after row X1 is replaced with a spare row. When only cells along row X1 are defective, the current count output of the top level counter 24 will be 0 (step 72) because during the row X1 clearing process the first level counter would have decremented its count to 0. The 0 count output of the top level counter would tell computer 14 that all defective cells have been located and replaced with a spare row or column and that computer 14 could therefore terminate the failure analysis process (step 74). However if one or more cells other than the cells of row X1 were defective, then the count output of the top level counter 24 would be non-zero at step 72, and computer 14 would have to take another look at the outputs of third level counters 24 (step 78) and may have to read fail data of one or more third level areas of ECM 22 (step 86) to determine where those defective cells are and how to allocate additional spare rows and columns to fix them at step 82.

For example if all cells along both row X1 and column Y1 and one additional cell at address (X2,Y2) were defective, then computer 14 would find at step 70 that the first level fail counter 24 has an output count of M+N. On reading the second level fail counts associated with areas A–D at step 76, computer 14 would find that area A had the highest fail count and would therefore next read counts of third level counters 24 for only subdivisions E1–E4 and I1–I4 of area A (step 78). In doing so computer 14 would discover that the counter for area E1 had the highest third level fail count. It would then look at the fail data in ECM 22 associated only with area E1 (step 86) and determine (step 88) that all cells in along row X1 and column Y1 within area E1 are defective and that row X1 and column Y1 therefore must each be replaced by a spare row or a spare column. Computer 14 would also find that the cell at address (X2, Y2) is defective but would not yet have sufficient information to determine whether it should allocate a spare row or column to repair the defective cell at address (X2, Y2). Computer 14 would not know yet how many of the total M+N failed cells will be replaced by the spare row and column assigned to row X1 and column Y1.

Thus after allocating a spare row and a spare column to replace defective row X1 and column Y1 (step 82) and clearing the corresponding row X1 and column Y1 of ECM 22 (step 84), computer 14 would look again at the count output of the top level counter 24 (step 70) to determine how many failed cells would remain in DUT 12 after row X1 and column Y1 have been replaced. It would see a total fail count of 1. Since it would already know the address (X2, Y2) of that cell, computer 14 would thereafter at step 80 have sufficient information at step 82 to determine that it can allocate either a spare row or a spare column to replace the cell at address (X2, Y2). After clearing an appropriate row or column of ECM 22 (84), computer 14 would see that the first level count has fallen to 0 (step 72) and would be able to end the error analysis process (step 74).

Occasionally after reading the ECM fail data for some third level area (step 86) within a second level area of interest having the highest fail count, computer 14 will not have sufficient information at step 88 to decide that it can assign a spare row or column to fix one or more failed cells and will not be able to determine whether it must discard the DUT at step 83 as having a pattern of cell failures for which there are insufficient numbers of spare rows and columns to repair the cell. When there is another third level area within the second level area of interest that also contains failed cells (step 92), computer will then read the error data for that other third level area (step 86). If the data collected thus far still does not enable computer 14 to determine that it should either allocate some spares (step 82) or to discard the DUT (step 94), it acquires the ECM error data for another level area (if any) that includes failed cells.

Computer 14 repeatedly executes steps 86, 88 and 92 retrieving the ECM fail data for each third level area within a given second level area of interest until at step 88 it has enough information to determine at step 82 whether to allocate a spare row or column or to discard the DUT, or to allocate at least one spare row or column at step 82, or until it finds at step 92 that it has already acquired ECM data for all third level areas within the second level area of interest. In the later case, computer 14 selects another second level area of interest (if any) having failed cells (step 94), and returns to step 78. Computer 14 then loops through steps 80, 86, 88 and 92 gathering ECM fail data for third level areas within the newly selected second level area until it can allocate a spare row or column at step 82, or can determine that the DUT should be discarded at step 83, or finds at step 92 that it has acquired the ECM data for all third level errors within the second level area last selected at step 94. In the later case it selects yet another second level area (if any) containing failed cells and starts checking ECM data for associated third level areas. After computer 14 finds at step 88 that it has already acquired ECM data for all third level areas containing defective cells and is unable to find a way to allocate spare rows and columns so as to replace all defective cells, it will decide to discard the DUT at step 83 and terminate the analysis process (step 74).

Thus computer 14 acquires fail counter and/or ECM data from tester 10, allocates spare rows or columns based on that data, clears ECM rows or columns to reflect the effects of the allocated spare rows and columns. It repeats that data acquisition, spare allocation , and clearing process until it reaches a point where either all failed cells have been replaced by spare rows or columns or where the computer 14 can determine that the DUT has a cell failure pattern that cannot be repaired by appropriately allocating the available number of spare rows and columns. In most cases the counts provided by programmable area counters 24 help computer 14 to avoid having to read large amounts of the ECM fail data during this process, and in some cases the counts will enable the computer to avoid reading any ECM fail data.

Computer 16 can program tester 10 to test random access memories having varying numbers of rows and columns as well as varying numbers of spare rows and columns. Area fail counters 24 are accordingly made programmable so that the area for which each counter 24 counts failed cells can be adjusted to suit the row and column dimensions of the RAM being tested, the available number of spare rows and columns, and the error analysis strategy employed by computer 14. The three-level hierarchical pattern of area assignments illustrated in FIGS. 3–6 therefore is not fixed; the same set of counters 24 could provide other area assignment patterns having varying numbers of hierarchical levels.

Figure 10:
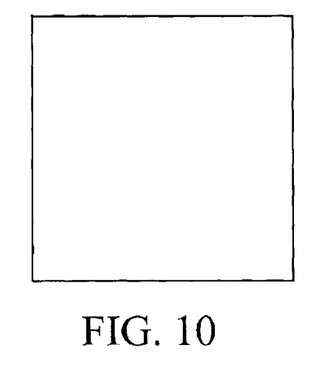
FIGS. 10–16 illustrate additional ways in which various areas of the memory space of the RAM being tested may be assigned to the fail counters of FIG. 1.
Figure 11:
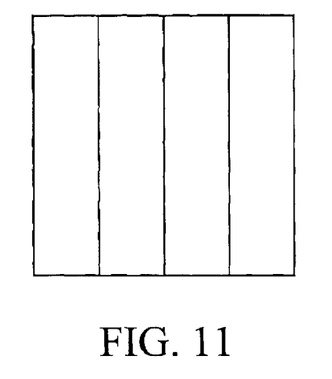
Figure 12:
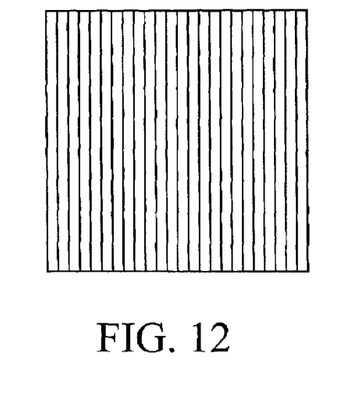

For example FIGS. 10–12 illustrate a three level pattern using the same number (37) of area counters as the pattern of FIGS. 3–6. While the pattern of FIGS. 10–12 also sets a first level counter 24 to count failed cells in the entire memory space of the DUT, the second level counters span divide the DUT's memory space only vertically as illustrated in FIG. 11 rather than both vertically and horizontally as illustrated in FIG. 4. The third level counters further divide each second level area only in the vertical direction. This particular pattern is preferable when the DUT has a high ratio of spare columns to regular columns and there are a sufficient number of spare columns to replace every column of one of the third level areas of FIG. 12. When errors occur in only one third level area, the computer could decide to replace every column in that third level area without having to read any ECM data.

Figure 9:
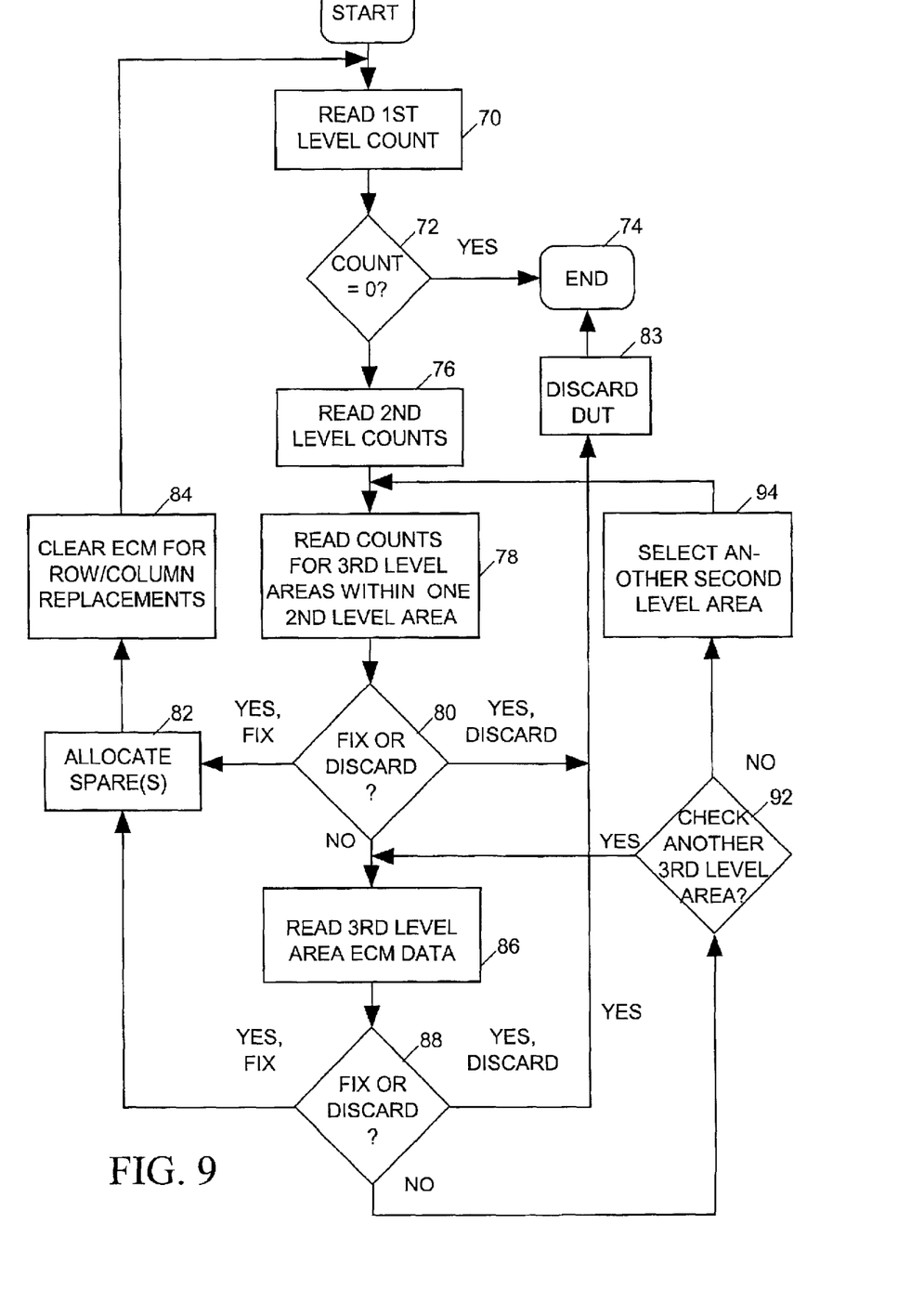
FIG. 9 is a flow chart depicting another algorithm the computer of FIG. 1 may use when accessing test results data and determining how to allocate spare rows and columns to replace rows and columns of a RAM containing defective cells.
Figure 13:
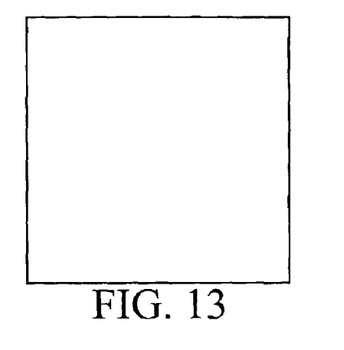
Figure 14:
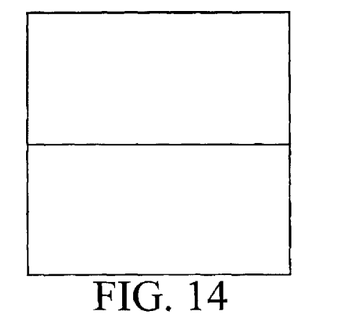
Figure 15:
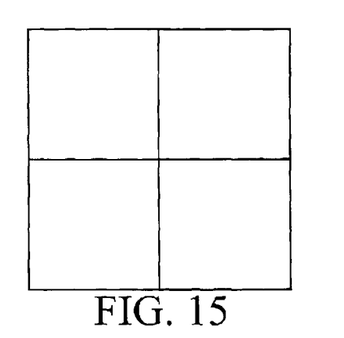
Figure 16:
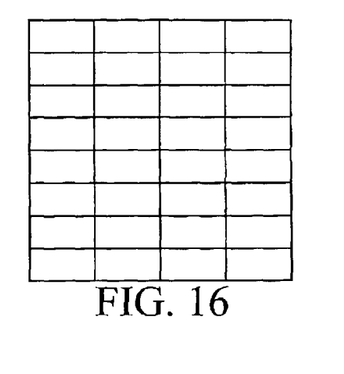
Figure 17:
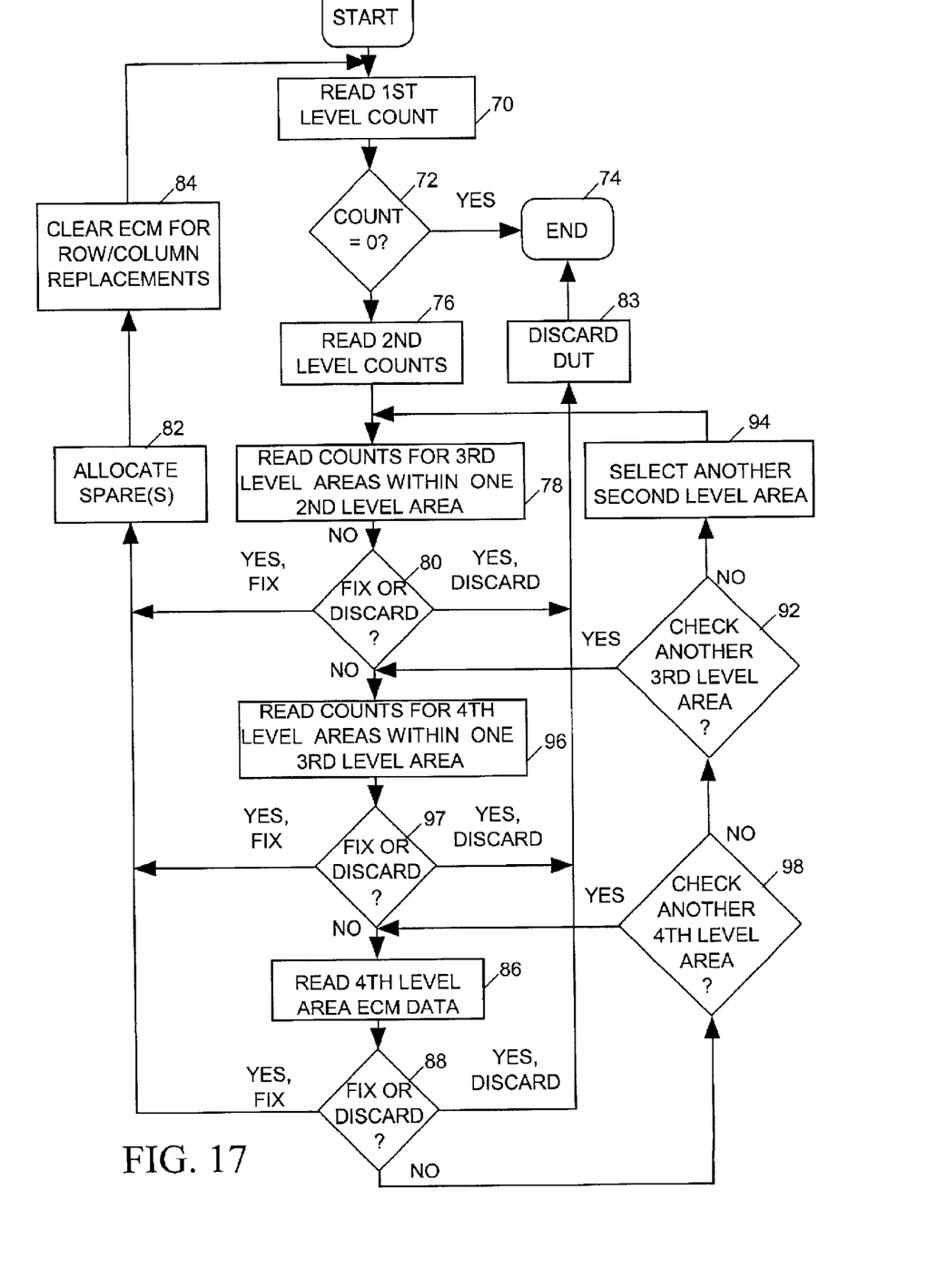
FIG. 17 is a flow chart depicting another algorithm the computer of FIG. 1 may use when accessing test results data and determining how to allocate spare rows and columns to replace rows and columns of a RAM containing defective cells.

FIGS. 12–14 illustrate a four-level hierarchy implemented using 39 area fail counters 24 While the algorithm illustrated in FIG. 9 is suitable for use in connection with a three-level fail count hierarchy, it should be understood that the algorithm could be easily adapted as illustrated in FIG. 17 for use in connection with a four-level hierarchy. The four-level hierarchy algorithm of FIG. 17 is generally similar to the three-level hierarchy algorithm of FIG. 9 except that steps 96–98 have been added to accommodate the fourth hierarchical level. The algorithm could be further expanded in a similar manner to accommodate fail counter organizational schemes having additional hierarchy levels.

Fail counters 24 need not be organized into multi-level hierarchies as illustrated above; all counters 24 may be assigned to separate, non-overlapping areas of the DUT's memory space. For example when DUT 12 has only 32 rows, has only spare rows and no spare columns, and when tester 20 has at least 32 available area fail counters, it would be beneficial to assign each fail counter to count errors of a separate row.

Clearing the Error Capture Memory

As discussed above, when computer allocates a spare row or column to replace one or more rows or columns of DUT 12, it tells tester 10 to "clear" the corresponding row or column of ECM 22 by setting fail data bits in that row or column to a "0". Referring again to FIG. 1, tester 10 includes a "check address" stack 28 that computer 14 can access via a stack controller 30. Computer 14 initially pushes the row addresses of the rows onto stack 28 via bus 15 and then sends a "CLEAR_ROW" command to controller 16. Controller 16 responds to the CLEAR_ROW command by reading the next row address in stack 28 and writing a "0" to each cell within that row of ECM 22 in the manner described above. Thereafter controller 16 returns a READY response to computer 14. Computer 14 then pushes the address of every column to be replaced onto stack 28 and sends a "CLEAR_COL" command to controller 16. Controller 16 responds by reading each column address in stack 28, and then writing a "0" to each cell within that column of ECM 22 in the manner described above. Thereafter controller 16 sends a READY signal to computer 14. As discussed above, area fail counters 24 appropriately decrement their counts whenever a fail bit in ECM 22 changes from a 1 to a 0.

Read Accessing the Error Capture Memory

During the error analysis process ECM 22 contains a bit map of defective DUT cells of only those rows and columns for which computer 14 has not already assigned a spare row or column. As described above, computer 14 may have to access fail data in some particular area of ECM 22 at step 86 of FIG. 9 to determine how to allocate additional spare rows and columns. To do so computer 14 sends row and column range data indicating the addresses of opposing corners of the area of ECM 22 to controller 16 and then sends a "READ_DATA" command to controller 16. Controller 16 then sequentially read accesses the fail data stored at every cell of ECM 22 within the boundaries of the area defined by the row and column range data.

Figure 18:
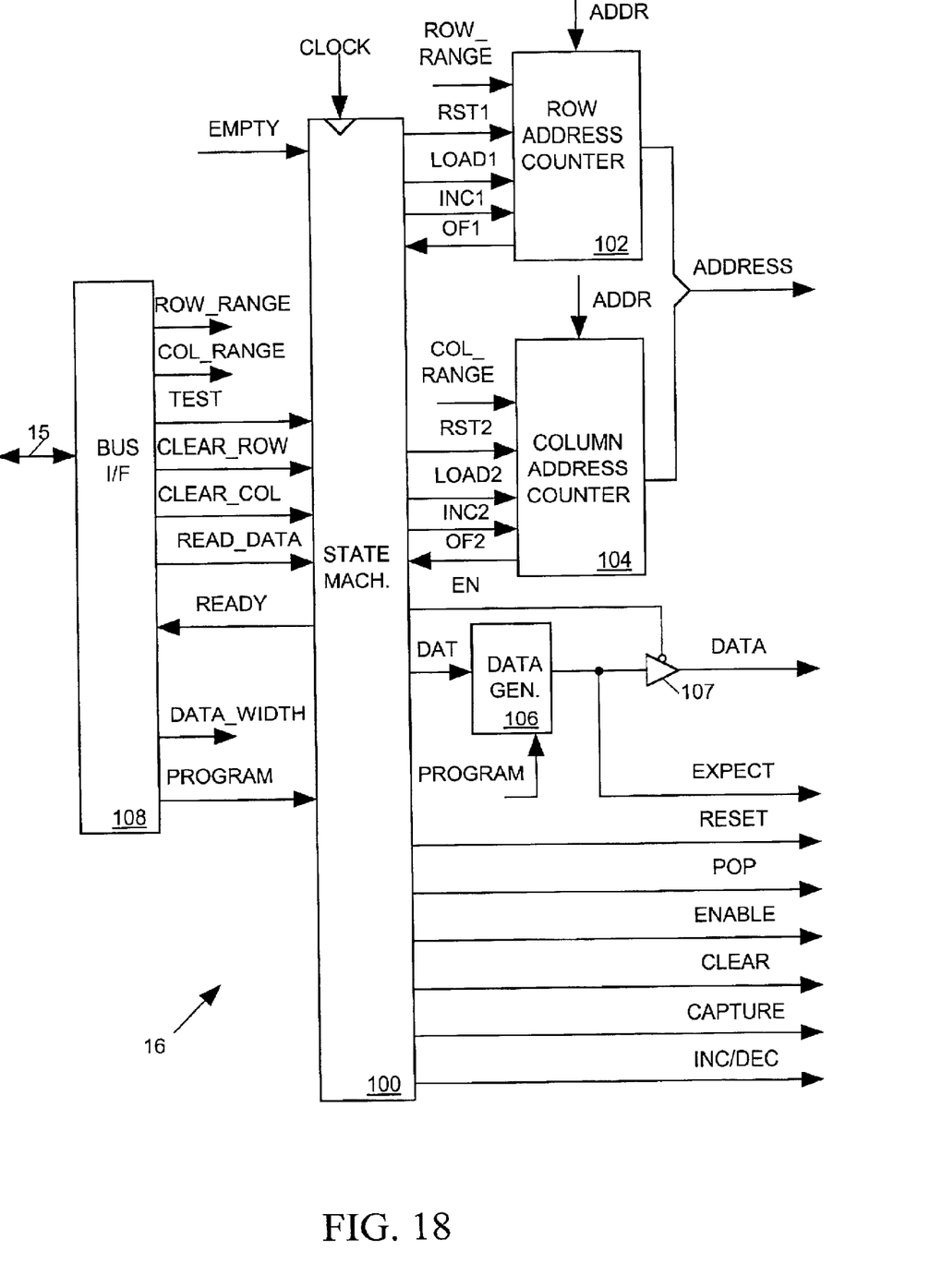
FIG. 18 depicts the controller of FIG. 2 in more detailed block diagram form.

As each cell is read addressed, ECM 22 reads out the data bit stored in that cell on the FAIL_OUT data line. The FAIL_OUT line provides an input to another stack controller 32 enabled by an signal (ENABLE) asserted by controller 16. When the FAIL_OUT bit is a "1" indicating the corresponding cell of DUT 12 is defective, stack controller 32 pushes the current address appearing on the ADDRESS bus onto a "fail address" stack 34. However when the FAIL_OUT bit is a "0" indicating the DUT cell corresponding to the current ECM address is operational, controller 32 does not push that address onto fail address stack 34. Thus after tester 10 reads every ECM cell in the area of interest, fail address stack 34 holds the address of every defective DUT cell residing within that area. At that point controller 16 returns another READY response to computer 14. Computer 14 then reads the addresses of the defective cells out of fail address stack 34 via stack controller 32 and bus 15. Controller FIG. 18 illustrates controller 16 of FIG. 1 in more detailed block diagram form. Controller 16 includes a state machine 100 clocked by a system clock (CLOCK) for sequencing controller operations, a row address counter 102 and a column address counter 104 for generating row and column address portions of the controller's output ADDRESS field placed on an address bus 80, a data generator 106 for generating the controller's output DATA and EXPECT fields, and a bus interface circuit 108 for communicating with the computer via bus 15.

Bus interface circuit 108 includes internal addressable registers to which computer 14 can write data via bus 15. The data in one of those registers encodes commands from computer 14 supplied as input bits to state machine 100. Each command tells state machine 100 to carry out a separate procedure. DUT's having variable numbers of rows and columns can be tested. A ROW_RANGE data value and a COL_RANGE data value stored in registers within bus interface 108 indicate the range of row and column addresses of DUT 12 and are applied to row and column address counters 102 and 104 to set their upper and lower count limits. Bus interface circuit 108 also transmits a READY response from state machine 100 to computer 14 in the form of an interrupt. Data generator 106 generates data test patterns during the memory test. Computer 14 programs data generator 106 to produce a desired test data sequence by transmitting a program to data generator 106 via bus 15 and bus interface 108.

TEST Command

The TEST command tells state machine 100 to carry out the test procedure illustrated in FIG. 2. Referring to FIGS. 1, 2 and 17, state machine 100 pulses the RESET signal to reset counters 24 and to clear stacks 28 and 34 during the initialization step 40. State machine 100 also clears ECM 22 during the initialization step 40 by writing a 0 to each ECM cell. To do so, state machine 100 first pulses an RST1 and an RST2 signal to reset the contents of row and column address counters to the lowest row and column addresses indicated by the ROW_RANGE and COL_RANGE data, thereby setting the ADDRESS field to address the first row and column of the ECM. State machine 100 then pulses the CAPTURE signal while asserting a CLEAR signal input to ECM 22. The CLEAR signal tells ECM 22 to store a 0 at its current address, rather than the FAIL_IN bit when the CAPTURE signal is asserted. State machine 100 then pulses an INC2 signal to tell address counter 104 to increment the column address so that the ADDRESS field now addresses row 0 column 1 of ECM 22. State machine 100 then asserts the CLEAR signal and pulses the CAPTURE signal to store a 0 at that address. State machine 100 continues this process until column address counter 104 reaches the maximum column address limit indicated by the COL_RANGE data and asserts an overflow signal OF2. This signal tells state machine 100 to pulse RST2 to reset the column address count to 0, and to pulse INC1 to increment the row address count to 1. State machine 100 continues in a similar fashion to write a 0 to each ECM 22 storage location of the remaining rows within the range indicted by the ROW_RANGE data, at which point row and column address counters 102 and 104 assert their overflow signals OF1 and OF2. State machine 100 then sends a READY response to computer 14 via bus interface 108.

Having reset row and column counters 24, cleared stacks 28 and 34, and written 0's to all storage locations in error capture memory 22, state machine 100 operates row and column address counters 102 and 104 in a similar manner so that they successively address each cell of DUT 12 during the test. Data generator 106 generates the EXPECT field during the test. A DAT bit output of state machine 100 tells data generator 106 whether the EXPECT field is all 0's or all 1's. A tristate driver 107 selectively places the EXPECT field on the DATA bus during memory write operations in response to an enable bit EN provided by state machine 100. The data word width of DUT 12 is variable. Computer 14 writes a data value (DATA_WIDTH) into a register within bus interface 108 indicating the data word width of DUT 12. That data is supplied to comparator 20 (FIG. 1) to indicate how many bits of the DATA and EXPECT fields are to be compared.

CLEAR_ROW, CLEAR_COL Commands

The CLEAR_ROW command tells state machine 100 to clear every row of ECM 22 for which computer 14 has loaded a row address into the check address stack 28. State machine 100 responds to the CLEAR_ROW command by resetting column address counter 104 and pulsing a LOAD1 signal causing row address counter to load (set its output count) to the value of the first row address in stack 28. State machine 100 also pulses a POP signal input to stack controller 30 telling it to pop that row address off stack 28. With the ADDRESS field set to address the first storage location of the first row to be cleared, state machine 100 clears all storage locations of the row by asserting the CLEAR signal and successively incrementing the column counter 104 while pulsing the CAPTURE signal. State machine 100 then pulses a POP signal input to stack controller 30 telling it to pop the first row address off stack 28 so that the address of a second row to be cleared is available to row address counter 102. State machine 100 then loads that second row address into row address counter 102 and repeats the process to clear all storage locations of that second row. State machine 100 further repeats this process to clear all ECM storage locations of all rows addresses stored in check address stack 28. An EMPTY signal produced by stack controller 30 tells state machine 100 when stack 28 is empty. State machine 100 thereafter sends the READY response back to computer 14. State machine 100 responds to the CLEAR_COLUMN command in a generally similar manner except that it loads column addresses from stack 28 into column address counter 104 and increments row address counter 102 to step through row addresses, thereby clearing ECM storage locations on a column-by-column basis instead of on a row-by-row basis.

READ_DATA command

The READ_DATA command computer 14 sends to state machine 100 tells it to read data out of an area of ECM 22. Before sending the READ_DATA command, computer 14 sends new ROW_RANGE and COL_RANGE data to bus interface circuit 108 indicating the area of ECM 22 memory space to be read. State machine 100 responds to the READ_DATA signal by progressively stepping row address counter 102 and column address counter 104 so that they address each storage location of ECM 22 within the range identified by the ROW_RANGE and COL_RANGE data. State machine 100 pulses the ENABLE signal whenever it changes the row and/or column address to permit stack controller 32 (FIG. 1) to push the current ADDRESS field onto fail address stack 34 when the currently FAIL_OUT data indicates a DUT cell failure at that address. State machine 100 returns a READY signal to computer 14 after it has read accessed all of the storage ECM 22 storage locations within the area specified by the ROW_RANGE and COL_RANGE data. Computer 14 then reads the addresses of defective memory cells from the fail address stack 34.

Area Fail Counter

Figure 19:
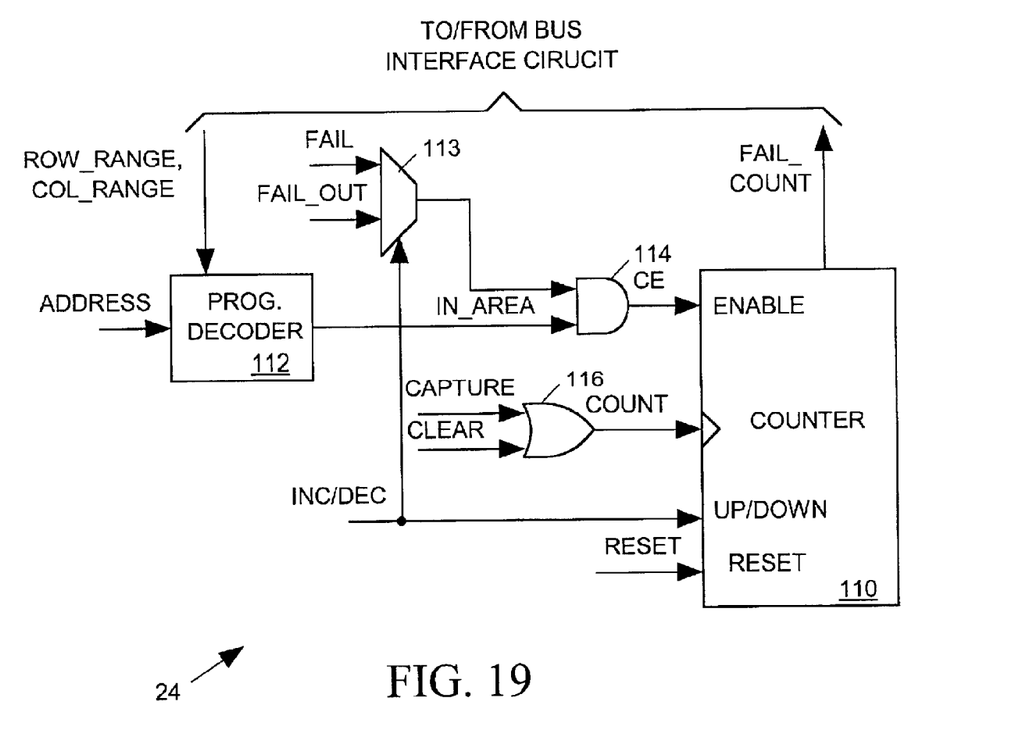
FIG. 19 depicts one of the fail counters of FIG. 2 in more detailed block diagram form.

FIG. 19 illustrates one of area fail counters 24 of FIG. 1 in more detailed block diagram form. Counter 24 includes a conventional counter 110 for maintaining a count of defective memory cells of DUT 12 of FIG. 1. A RESET signal from controller 16 of FIG. 1 resets the counter 110.

A decoder 112, programmed by ROW_RANGE and COL_RANGE control data from computer 14 via bus 15 (FIG. 1), decodes the ADDRESS output of controller 16 of FIG. 1 to produce an output signal IN_AREA indicating when the address applied to ECM 22 and DUT 12 is within an area of the memory space of DUT 12 wherein cell addresses lie within the ranges of row and column addresses identified by the ROW_RANGE and COL_RANGE data.

During the memory testing process, the FAIL signal output of AND gate 26 of FIG. 1 will go true only the first time that a cell at a DUT address referenced by the ADDRESS field fails a test. The INC/DEC output of controller 16 (which is true during cell testing and which sets counter 110 to count up) sets a multiplexer 113 to pass the FAIL signal to an input of an AND gate 114. AND gate 114 AND's the IN_AREA signal with the FAIL signal to supply a count enable signal CE input to the enable terminal of counter 110. Thus counter 110 is enabled to count up the first time that the currently addressed cell of DUT 12 fails a test. An OR gate 116 ORs the CAPTURE and CLEAR signals output of controller 16 to provide a COUNT signal input which clocks counter 110. Counter 110 therefore counts up once on each CAPTURE signal pulse that occurs when the counter is enabled. Thus during the testing process, counter 110 counts up the number of defective cells within an area of the RAM array of DUT 12 specified by the ROW_

RANGE and COL_RANGE control data input to programmable decoder 112.

During an ECM row or column clearing process, controller 16 of FIG. 1 sets the INC/DEC signal false to tell counter 110 to count down on each pulse of the CAPTURE signal occurring while counter 110 is enabled. The INC/DEC signal also signals multiplexer 113 to passes the FAIL_OUT data bit read out of a currently addressed ECM 22 storage location to AND gate 114. Thus during an ECM row or column clearing operation, counter 110 counts down by the number of defective cells within the row or column being cleared by the clearing operation.

Thus has been shown and described a memory tester 10 in accordance with the invention for testing a memory DUT 12 and for providing a computer 14 with enough information to determine how to efficiently allocate spare rows and columns for replacing rows and columns containing defective memory cells. As discussed above, computer 14 can quickly read the relatively small amount of data in fail counters 24 and in many cases, can determine how to allocate spare rows and columns based on the counter output data alone. When the fail counter data alone is insufficient to enable computer 14 to determine how to repair the memory, the computer can obtain fail data stored in ECM 22. However the count outputs of counters 24 enable computer 14 to carefully select the memory areas of ECM 22 tester 10 read accesses. Since this limits the amount of fail data tester 10 must return to the computer 14, it limits the amount of time computer 14 needs to acquire useful test results data.

By giving a user the ability to independently program each counter 22 to count errors in any desired rectangular area of the memory array, tester 10 gives the user the flexibility to allocate the DUT's memory space among the counters in a manner that best suits the dimensions of the array being tested and the number of available spare rows and columns.

While tester 10 is described as testing a DUT by write and read accessing the memory cells using a particular sequence of address and data patterns, it should be understood that other address and data pattern sequences could be employed.

The forgoing specification and the drawings depict what the applicant(s) consider to be the best mode(s) of practicing the invention, and elements or steps of the depicted best mode(s) are examples of the elements or steps recited in the appended claims. However the appended claims are intended to apply to any mode of practicing the invention comprising the combination of elements or steps as recited in any one of the claims, including elements or steps that are functional equivalents of the example elements or steps depicted in the specification and drawings. Should any appended claim describe an element by providing a description of its particular function including no express structural limitations, then that description of the element is intended to read on anything capable of carrying out that particular function, regardless of its structure and regardless of the structure of any example element depicted in this specification or in the drawings.

What is claimed is:

1. An apparatus responsive to input control data and commands for performing a test on a memory array having rows and columns of memory cells and for generating output data characterizing test results, wherein each memory cell resides in one row and in one column, wherein each row has a separate row address, wherein each column has a separate column address, and wherein each memory cell has a separate address formed by a unique combination of row and column addresses of the row and column in which the memory cell resides, the apparatus comprising:

a memory tester for testing each memory cell and producing fail data indicating whether the memory cell is defective; and a plurality of counters, wherein each counter corresponds to an area of the memory array including only memory cells having addresses formed by any combination of row and column addresses within a particular row address range and a particular column address range separately specified for each counter by the input control data, and wherein each counter monitors the fail data produced by the memory tester to determine which memory cells are defective and generates a count of a number of defective memory cells residing within its corresponding area, such that counts produced by the counters characterize the test results.

2. The apparatus in accordance with claim 1 further comprising an error capture memory (ECM) having rows and columns of ECM cells, each for storing the fail data generated by the memory tester, wherein each ECM cell corresponds to a separate one of the memory cells, and wherein when the memory tester tests each memory cell, it sets the fail data in the memory cell's corresponding ECM cell to indicate whether the memory cell is defective.

3. The apparatus in accordance with claim 2, wherein the memory tester responds to a first input command specifying a row address range and a column address range by reading the fail data in each ECM cell corresponding to memory cells residing within both the specified row and column address ranges.

4. The apparatus in accordance with claim 3 wherein when the memory tester reads fail data out of an ECM cell indicating that the corresponding memory cell is defective, the memory tester provides data identifying the defective memory cell as output data characterizing test results.

5. The apparatus in accordance with claim 4, wherein the memory tester responds to a second input command identifying one of either a row or a column of the memory array by reading the fail data in ECM cells corresponding to all memory cells of the identified row or column of the memory array, and signaling each counter to decrement its count when the fail data read out of any ECM cell corresponding to a memory cell within the counter's corresponding memory area indicates that the memory cell is defective.

6. The apparatus in accordance with claim 5 wherein the tester also responds to the second input command by setting the fail data stored in each ECM cell corresponding to a memory cell of the identified row or column identified by the second command to indicate that the corresponding memory cell is not defective.

7. A method for testing a memory array having addressable rows and columns of memory cells and for generating output data characterizing test results, wherein each memory cell has a separate address formed by a unique combination of row and column addresses of a row and a column in which the memory cell resides, the method comprising the steps of:

a. testing each memory cell to determine whether the memory cell is defective;

b. generating a separate count corresponding to each of a plurality of separately specified areas of the memory array, wherein each area encompassing only memory cells having addresses formed by any combination of row and column addresses lying with a range of row addresses and a range of column addresses, and c. providing the counts as output data characterizing test results.

8. The method in accordance with claim 7 further comprising the steps of:

d. providing an error capture memory (ECM) having rows and columns of ECM cells for storing fail data, wherein each ECM cell corresponds to a separate one of the memory cells, and e. setting the fail data in each ECM cell corresponding to a memory cell after the memory cell is tested at step (a) to indicate whether the corresponding memory cell is defective.

9. The method in accordance with claim 8, further comprising the step of:

f. responding to a first input command referencing an area corresponding to one of the counts by reading the fail data in each ECM cell corresponding to a memory cell residing within that area, and processing the fail data to generate output data characterizing test results by identifying each defective memory cell within the area specified by the first input command.

10. The method in accordance with claim 9 further comprising the step of:

g. responding to a second input command identifying one of either a row or a column of the memory array, by reading the fail data in ECM cells corresponding to all memory cells of the identified row or column, and h. for each count, decrementing the count whenever the fail data read out of any ECM cell at step (g) indicates that a memory cell within memory area corresponding to the count is defective.

11. The method in accordance with claim 10 further comprising the step of:

i. further responding to the second input command by setting the fail data stored in ECM cells corresponding to every memory cell of the row or column identified by the second input command to indicate that the corresponding memory cells are not defective.

12. A method for testing a random access memory (RAM) having addressable rows and columns of memory cells, and having spare rows and columns of memory cells, and for providing a computer with information enabling it to determine how to efficiently allocate spare rows and columns for replacing rows and columns containing defective memory cells, the method comprising the steps of:

a. testing each memory cell to determine whether it is defective;

b. writing fail data into an error capture memory (ECM) having ECM cells for storing fail data, wherein each ECM cell corresponds to a separate memory cell of the RAM, and wherein the fail data written into each ECM cell indicates whether its corresponding memory cell was determined at step (a) to be defective;

c. maintaining a plurality of counts, each count indicating a number of defective memory cells within a corresponding one of a plurality of separate areas of the RAM, wherein a particular set of memory cells included in each area is separately selected for each area by control data; and d. providing the computer with access to the counts after all memory cells have been tested at step (a).

13. The method in accordance with claim 12 further comprising the steps of:

e. responding to a first input command from the computer identifying an area of the RAM corresponding to any one of the counts by reading out and processing fail data from ECM cells corresponding to memory cells included in the identified area;

f. processing the fail data read out at step (e) to generate results data indicating which memory cells within the identified area are defective; and g. providing the results data to the computer.

14. The method in accordance with claim 13 further comprising the steps of:

h. responding to a second input command identifying one of either a row or a column of the RAM by reading the fail data in ECM cells corresponding to all memory cells of the identified row or column, and i. for each count, decrementing the count whenever the fail data read out of any ECM cell at step (h) indicates that a memory cell within the memory area corresponding to the count is defective.

15. The apparatus in accordance with claim 14 further comprising the step of:

j. following step (h), further responding to the second input command to indicate that the corresponding memory cells are not defective.

16. An apparatus for performing a test on a memory array and generating data characterizing test results, wherein the memory array includes rows and columns of memory cells such that each memory cell resides in one row and in one column, wherein each row has a separate row address, wherein each column has a separate column address, and wherein each memory cell has an address formed by a unique combination of row and column addresses of the row and column in which the memory cell resides, the apparatus comprising:

a memory tester for testing each memory cell and producing fail data indicating whether the memory cell is defective; and a plurality of counters,
wherein each counter corresponds to an area of the memory array,
wherein each counter monitors the fail data produced by the memory tester to determine which memory cells are defective and generates a count of a number of defective memory cells residing within its corresponding area, whereby counts produced by the counters characterize the test results, and
wherein a first counter of the plurality of counters corresponds to a first area of the memory array that is larger than, and wholly encompasses, a second area of the memory array to which a second counter corresponds.

17. The apparatus in accordance with claim 16 wherein the first area includes all of the memory array.

18. The apparatus in accordance with claim 17 wherein a third counter corresponds to a third area of the memory array, separate from the second area, smaller than the first area, and residing wholly within the first area.

19. The apparatus in accordance with claim 17 wherein a third counter corresponds to a third area of the memory array overlapping with the second area, smaller than the first area, and residing wholly within the first area.

20. An apparatus for performing a test on a memory array and generating data characterizing test results, wherein the memory array includes rows and columns of memory cells such that each memory cell resides in one row and in one column, wherein each row has a separate row address, wherein each column has a separate column address, and wherein each memory cell has an address formed by a unique combination of row and column addresses of the row and column in which the memory cell resides, the apparatus comprising:

a memory tester for testing each memory cell and producing fail data indicating whether the memory cell is defective; and a plurality of counters, wherein each counter corresponds to an area of the memory array, wherein each counter monitors the fail data produced by the memory tester to determine which memory cells are defective and generates a count of a number of defective memory cells residing within its corresponding area, whereby counts produced by the counters characterize the test results, and wherein each of a first portion of counters of the plurality of counters corresponds to an area of the memory array encompassing all memory cells of a plurality of rows of the memory array, and wherein each of a second portion of counters of the plurality of counters corresponds to an area of the memory array encompassing all memory cells of a plurality of columns of the memory array.

21. The apparatus in accordance with claim 20 wherein none of the areas to which the first portion of counters correspond overlap with one another, and wherein none of the areas to which the second portion of counters correspond overlap with one another.

22. The apparatus in accordance with claim 21 further comprising an error capture memory (ECM) having rows and columns of ECM cells, each for storing the fail data generated by the memory tester, wherein each ECM cell corresponds to a separate one of the memory cells, and wherein when the memory tester tests each memory cell, it sets the fail data in the memory cell's corresponding ECM cell to indicate whether the memory cell is defective.

* * * * *